United States Patent [19]

Daikoku et al.

[11] Patent Number: 4,770,242
[45] Date of Patent: Sep. 13, 1988

[54] COOLING DEVICE OF SEMICONDUCTOR CHIPS

[75] Inventors: Takahiro Daikoku; Tadakatsu Nakajima; Noriyuki Ashiwake; Keizo Kawamura; Motohiro Sato, all of Ibaraki; Fumiyuki Kobayashi, Sagamihara; Wataru Nakayama, Kashiwa, all of Japan

[73] Assignee: Hitachi, Ltd., Tokyo, Japan

[21] Appl. No.: 873,304

[22] Filed: Jun. 9, 1986

Related U.S. Application Data

[63] Continuation of Ser. No. 680,927, Dec. 12, 1984, abandoned.

[30] Foreign Application Priority Data

Dec. 14, 1983 [JP] Japan ............................. 58-234219

[51] Int. Cl.⁴ .............................................. F28F 7/00
[52] U.S. Cl. .................................... 165/185; 361/383; 361/386; 357/81
[58] Field of Search ..................... 165/185, 80.3, 80.4; 357/81; 361/382, 383, 386, 387, 388

[56] References Cited

U.S. PATENT DOCUMENTS

| | | | |
|---|---|---|---|
| 2,965,819 | 12/1960 | Rosenbaum | 165/80 B X |
| 4,226,281 | 10/1980 | Chu | 165/80.4 X |
| 4,235,283 | 11/1980 | Gupta | 165/80 C |
| 4,246,597 | 1/1981 | Cole et al. | 165/185 X |
| 4,254,431 | 3/1981 | Babuka et al. | 165/80 C X |
| 4,448,240 | 5/1984 | Sharon | 165/85 X |
| 4,450,693 | 5/1984 | Green et al. | 165/185 X |
| 4,483,389 | 11/1984 | Balderes et al. | 165/80 B |
| 4,498,530 | 2/1985 | Lipschutz | 165/185 |
| 4,535,841 | 8/1985 | Kok | 165/185 |

FOREIGN PATENT DOCUMENTS 8302363 7/1983 PCT Int'l Appl. .

OTHER PUBLICATIONS

IBM Technical Bulletin, Kammerer, "Thermal Conduction Button", vol. 19, No. 12, May 1977, p. 4622.
IBM Technical Disclosure Bulletin, vol. 19, No. 12, May 1977, "Thermal Conduction Stud" by Dombrowski, Hwang, p. 4683.
IBM Technical Disclosure Bulletin, vol. 24, No. 5, Oct. 1981, p. 2540.

Primary Examiner—Ira S. Lazarus
Assistant Examiner—Peggy Neils
Attorney, Agent, or Firm—Antonelli, Terry & Wands

[57] ABSTRACT

A cooling device for providing cooling of integrated circuit semiconductor chips is so arranged as to transfer a heat via thin fin members which are fitted with each other with a small clearance. The bottom surface of one of thermal conductive members which is provided integrally with the fin members is made greater in surface area than a back planar surface of the semiconductor chip, and the thermal conductive member and the semiconductor chip are kept at all times in plane contact with each other, thereby enhancing the cooling performance.

4 Claims, 10 Drawing Sheets

COOLING DEVICE OF SEMICONDUCTOR CHIPS

This application is a continuation of application Ser. No. 680,927, filed Dec. 12, 1984, now abandoned.

BACKGROUND OF THE INVENTION

The present invention relates to a cooling device for dissipating the heat generated by semiconductor elements or integrated circuit chips.

In a large-sized electronic computer system, it is demanded that the processing operation is performed at high speed. To this end, a circuit chip on which a large number of semiconductor elements are integrated has been developed in recent years. Further, in order to make short the electric wiring for interconnecting such integrated circuit chips, a method of mounting a large number of such integrated circuit chips in a micropackage is developed.

A cooling device which is disclosed in U.S. Pat. No. 3,993,123 has hitherto been proposed with regard, in particular, to a cooling device for use in the large-sized electronic computer system. In this cooling device, the heat generated by LSI chip is transferred into a piston via the helium-gas layer which exists around a portion of contact between a spherical tip end of the piston and a back planar surface of the LSI chip. The heat is then transferred from the piston into the helium-gas layer which exists in the clearance between this piston and a cylinder, thus transferred into a housing of a micro package. The heat is thus finally introduced, for dissipating, into a cooler which is provided on the housing and in which cooling water or cooling air is circulated.

The above-mentioned prior art cooling device, however, involves the following problems.

Thermal conductivity of helium-gas is relatively high as compared with other gases, but its thermal conductivity is very low as compared with that of a metallic body such as, for example, the piston, cylinder or the like. Accordingly, in order to make the thermal resistance of the layer of helium gas small, it is necessary to make the clearance between the piston and cylinder small. For this reason, the piston or cylinder is demanded to be fabricated with high precision. If it is fabricated with low precision, then, for example, the piston fails to be moved with smoothness, or the temperature of each LSI chip is likely to vary widely.

A cooling structure such as that disclosed in U.S. Pat. No. 4,263,965 has been proposed in order to solve the above-mentioned problems. In this structure, a number of parallel grooves are formed in a housing opposed to the LSI chips, and, in each groove, a thin rectangularly shaped thermal conductive plate and a leaf spring for applying a pressing force onto this thermal conductive plate are inserted. This structure is improved in that the surface area for effecting a heat exchange between the thermal conductive plate and the side walls of the parallel grooves is large and besides the thin planar surface of each thermal conductive plate is kept in plane contact with the planar surface of LSI chip at its one end surface.

The above-mentioned structure, however, involves the following problems. Since each thermal conductive plate is independently separated and inserted into its corresponding parallel groove, the heat exchange between adjacent thermal conductive plates is little effected. Since the integrated circuits on the LSI chip are composed of a number of electric circuits, it is, generally, very rare that such LSI chip generates heat uniformly. The distribution of heat generation in the LSI chip varies from place to place, as well as with the lapse of time. Accordingly, only the thermal conductive plate located near such peripheral portion serves to a portion of heat generation on the LSI chip dissipate the heat generated therefrom. In other words, the other thermal conductive plates which are located away from such portion of heat generation can serve to dissipate only the heat which has come via the LSI chip having a very small thickness. Namely, even if a number of thermal conductive plates are placed on the LSI chip, their efficiency of heat dissipation is decreased because the good heat transfer connection between these thermal conductive plates is little effected.

Further, since the maximum size where the thermal conductive plates can be mounted is limited by a width of the LSI chip, limitation is imposed upon increasing the cooling performance.

Further, a cooling device which uses a thermal conductive metallic plate bundle composed of laminated leaf springs is disclosed in Japanese Patent Laid-Open No. 23463/83. This cooling device has a drawback in that the thermal contact resistance between the leaf springs is high.

SUMMARY OF THE INVENTION

The present invention has been made in view of the above-mentioned drawbacks inherent in the prior art and the object of the present invention is to provide a cooling device for semiconductor elements or integrated circuit chips which is capable of exhibiting its high cooling performance and absorbing various displacements which include deformation of the substrate, displacements in connecting the semiconductor chips, deformations made in assembling the cooling structure, thermal deformations involved in the cooling structure, etc without exceeding the acceptable level of force on the semiconductor chip.

The present invention is characterized in that a plurality of first fins are integrally provided on a thermal conductive member having a bottom surface area which is greater than a surface area, i.e., heat dissipation area of a semiconductor chip; these first fins are fitted with a plurality of second fins provided on the inner surface of a housing with a small clearance; and the bottom surface of the thermal conductive member is pressed onto the planar surface of the semiconductor chip by means of a resilient member which is mounted between the thermal conductive member and the inner surface of the housing.

DETAILED DESCRIPTION OF THE PREFERRED EMBODIMENTS

Figure 1:
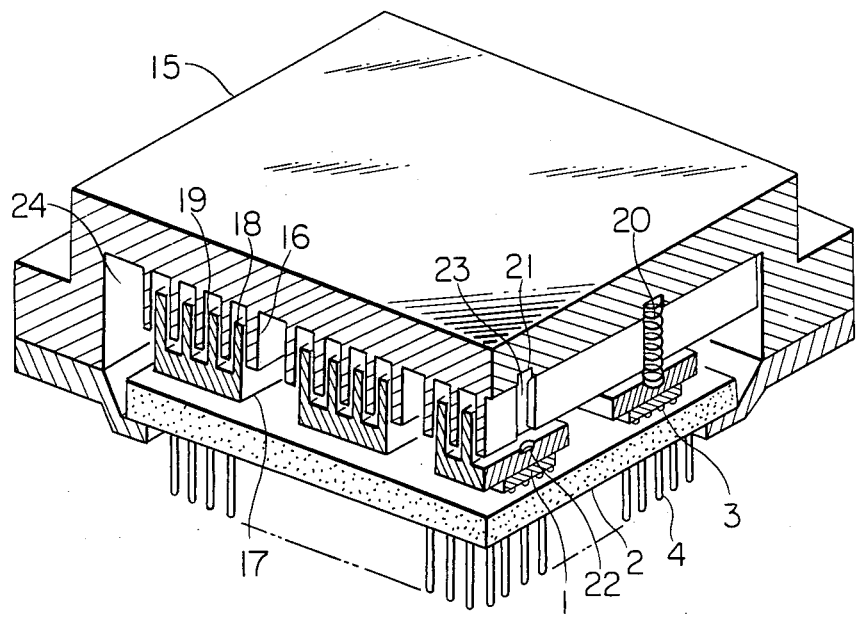
FIG. 1 is a partially sectioned perspective view showing an embodiment of the cooling device for providing cooling of integrated circuit semiconductor chips according to the present invention.
Figure 2:
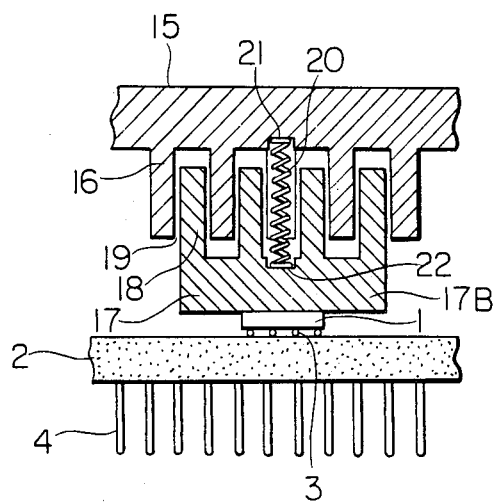
FIG. 2 is a vertical cross-sectional view of a main part of cooling device for the semiconductor chip shown in FIG. 1.
Figure 3:
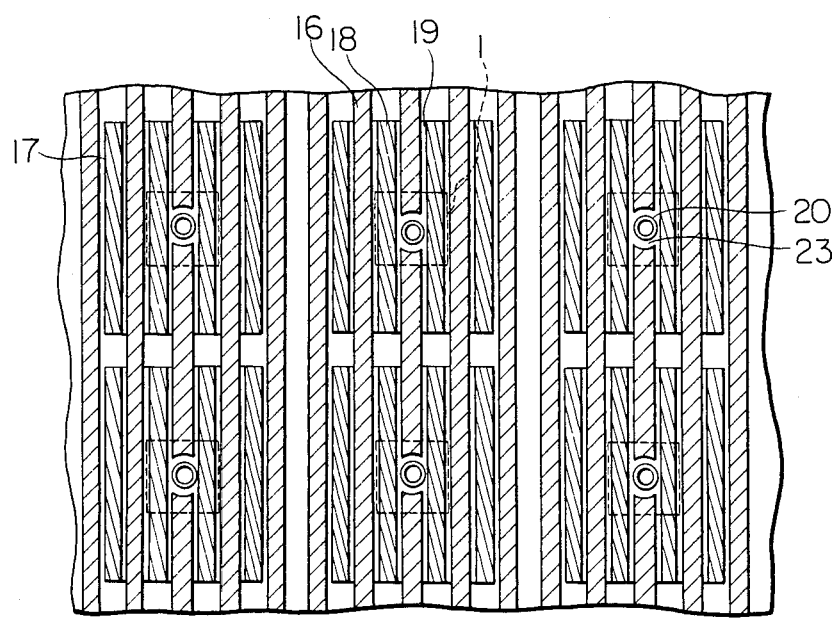
FIG. 3 is a horizontal cross-sectional view of a main part of the cooling device for semiconductor chips shown in FIG. 1.

An embodiment of the present invention will now be described by referring to FIGS. 1 to 4.

In the Figures, a housing 15 is made of material having a high thermal conductivity such as, for example, copper, aluminium, or the like, and on the inner surface of the housing, a number of plate-like fins 16 are provided in parallel with each other. Further, thermal conductive members 17 each have a surface area greater than the heat transfer area constituted by a back planar surface of an LSI chip 1, and have a base portion. On this base portion, a number of plate-like fins 18 are integrally provided at the same pitch as that at which the fins 16 are provided. The fins 16 of the housing 15 and the fins 18 of the base portion of the thermal conductive member 17 are fitted with each other with small clearances 19 provided therebetween. The base portion of the thermal conductive member 17 is pressed onto the planar surface of the LSI chip 1 by a spring 20 which has a small spring constant so as not to have any effect upon solder balls 3 for connecting the LSI chip 1. It thus is kept in plane-contact with the back planar surface of the LSI chip 1. The spring 20 is inserted into a gap 23 formed in the fin 16 and is fixedly held in a recess 21 formed in the housing 15 and a recess 22 formed in a center of the base portion of the thermal conductive member 17. Since, in this case, the points of action of the spring 20 reside in the respective recesses 21 and 22 of the base portion of the thermal conductive member 17 and the housing 15 respectively, the thermal conductive member 17 can be stably pressed onto the planar surface of the LSI chip 1 and, at the same time, the spring can have a sufficient length. Further, it is also possible to prevent the base portion of the thermal conductive member 17 from slipping off from the back planar surface of the LSI chip 1, thus to keep the thermal conductive member 17 at all times in plane-contact with the planar surface of the LSI chip 1 at its central part.

Within a closed space 24 which is defined between the housing 15 and a substrate 2, there is filled a gas having high thermal conductivity, such as, for example, helium gas, hydrogen gas, or the like. It should be noted here that a fluid capable of high heat conduction such as, for example, a heat conductive grease may be filled only in the small clearance 19.

Since this embodiment has been constructed as stated above, the heat which has been generated in the LSI chip 1 is once transferred into the base portion of the heat conductive member 17 kept in plane-contact with the planar surface of LSI chip 1 as a whole and then is diffused uniformly within the base portion. Thereafter, the heat is transferred into each fin 18 of the thermal conductive member 17. Thereafter, it is transferred into the fins 16 of the housing 15 through the gas layers of high thermal conductivity in the small clearances between the fins 16 and 18. The heat is finally carried away by a cooling device (not shown) which is mounted on the housing 15.

Figure 4:
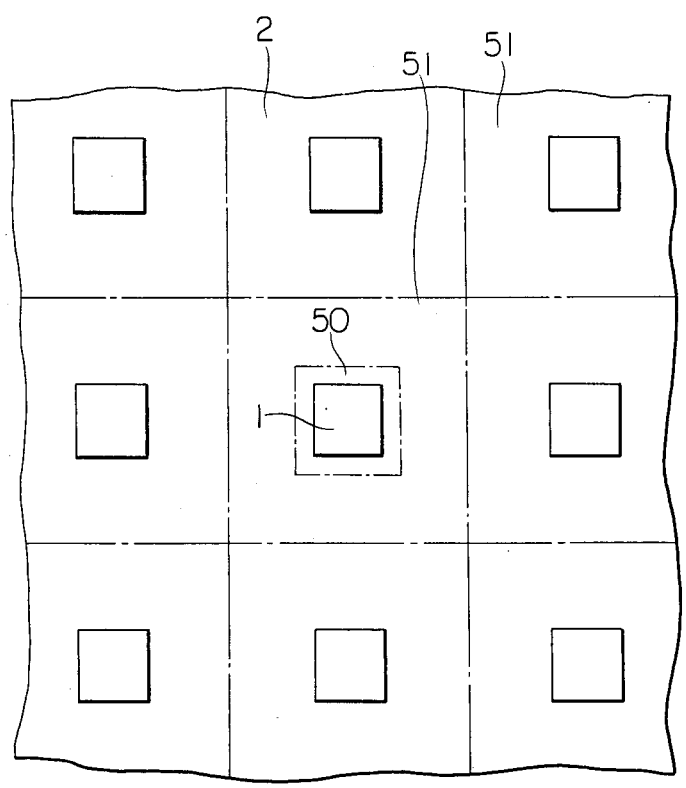
FIG. 4 is a plane view of a substrate on which semiconductor chips are mounted.

Since the fins 18 of the thermal conductive member 17 are formed integrally with the base portion thereof, the heat generated in the LSI chip 1 can be uniformly diffused within the base portion even when the distribution of the heat in the LSI chip 1 is non-uniform. Accordingly, it is possible to maximize the heat transfer efficiency in each fin 18 of the thermal conductive member 17. The thermal conductive member 17 can have any size which is chosen such that its area of projection of the thermal conductive member 17 on the substrate 2 falls within the range of from the minimum area of the back planar surface of the LSI chip 1 to the maximum area 51 which can be occupied by one LSI chip on the substrate 2, as shown in FIG. 4. Where a total cross-sectional area of either the fins 16 of the housing 15 or the fins 18 of the thermal conductive member 17 is smaller than the heat transfer area which is the back planar surface of the LSI chip 1, their heat transfer efficiency decreases due to the thermal resistance which is produced due to the reduction in the cross-sectional area. For this reason, it is desirable that the size of the thermal conductive member 17 be not smaller than the back-surface area of the LSI chip, or more preferably not smaller than an area 50 which is two or more times as large as the back-surface area. On the other hand, however, as the size of the thermal conductive member 17 is increased, this member 17 comes into contact with that of an adjacent LSI chip 1. Therefore, the size of the thermal conductive member 17 is limited to the maximum area 51 which can be occupied by one LSI chip 1 on the substrate 2.

Since the spring 20 is so disposed as to prevent its force from directly acting on the fins 16 and 18, there is no likelihood that those fins 16, 18 are bent or buckled. Therefore, the fins 16 and 18 may be thin. Further, since the base portion 17B of the thermal conductive member 17 is merely in contact with the LSI chip 1, it can be freely moved while it is kept in contact with the LSI chip 1. Besides, the thermal conductive member 17 can be freely separated from the LSI chip 1.

Figure 5:
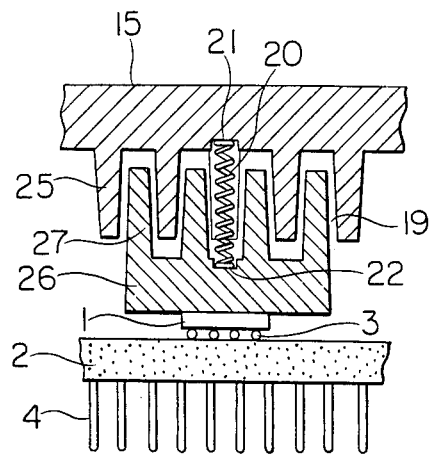
FIGS. 5, 6 and 7 are vertically sectional views of main parts of other embodiments of the present invention, respectively.

FIG. 5 shows another embodiment of the invention, in which each fin 25 integrally provided on the inner surface of the housing 15 and each fin 27 similarly provided on the thermal conductive member 26 have a trapezoidal section which is tapered toward its tip end. The other structure of this embodiment is the same as that of the embodiment shown in FIG. 1, and its description is omitted. By forming the vertical section of the fins 25 and 27 into such a trapezoidal shape, an advantage of facilitating the operation of shaping the fin is offered.

Figure 6:
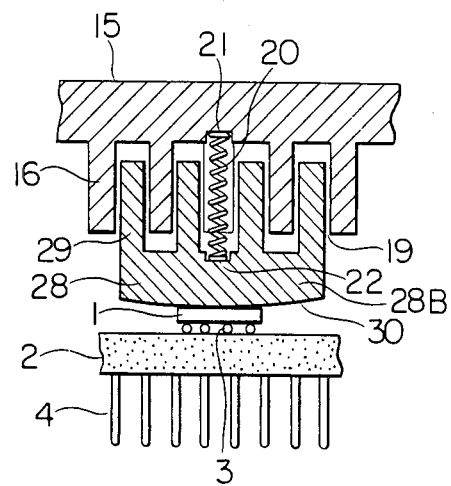

FIG. 6 shows another embodiment of the present invention, which is characterized in that the lowest or bottom surface of the base portion 28B of the thermal conductive member 28 is made into a cylindrical surface 30. A center axis of this cylindrical surface is extended to the same direction of the fin 29 of the thermal conductive member 28. If the thermal conductive member 28 is constructed as such, it is not only possible for the fins 29 of the thermal conductive member 28 and the fin 16 of the housing 15 to move freely in grooves between the corresponding fins but, even when the LSI chip 1 is inclined in a direction which intersects the fin 29, it is possible for the thermal conductive member 28 to follow the movement of the LSI chip 1, easily.

By making the bottom surface into the cylindrical surface, the thermal conductive member 28 comes into a line contact with the LSI chip 1, not into a point contact therewith which occurs where the bottom surface is made into a spherical surface, thereby making the contact thermal resistance low. Further, since the thermal conductive member 29 can follow the LSI chip 1 to an increased degree, it is possible to make the clearance 19 between the fins 16 and 29 smaller, thus finally to enhance the cooling performance of the heat conductive member.

Figure 7:
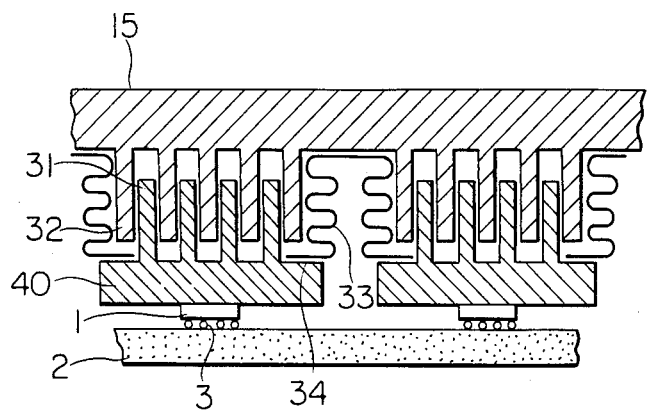
Figure 8:
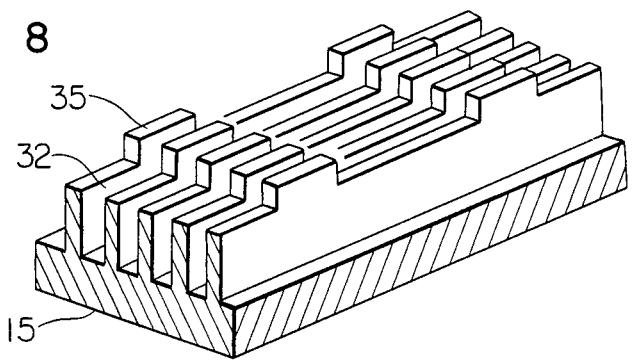
FIG. 8 is a perspective view, partially in section, of a detailed structure of a housing member shown in FIG. 7.
Figure 9:
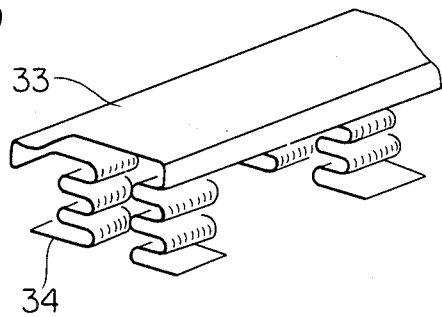
FIG. 9 is a perspective view, partially in section, of a detailed structure of a leaf spring shown in FIG. 7.

A further embodiment of the present invention will now be described with reference to FIGS. 7, 8 and 9.

A number of fins 32 which are provided on the inner surface of the housing 15 are formed with protrusions 35 at their tip ends. On the other hand, the surface of the thermal conductive member 40 which contacts the LSI chip 1 is flattened. When a number of fins 31 have been inserted between a number of the fins 32, it may be prevented from moving in the longitudinal direction of the grooves between the fins 32 and the thermal conductive member 40 is held in place between the protrusions 35. Further, the thermal conductive member 40 is pressed, at its both sides, by leaf springs 33 integrally formed with a number of springs 34, onto the LSI chip 1.

Figure 10:
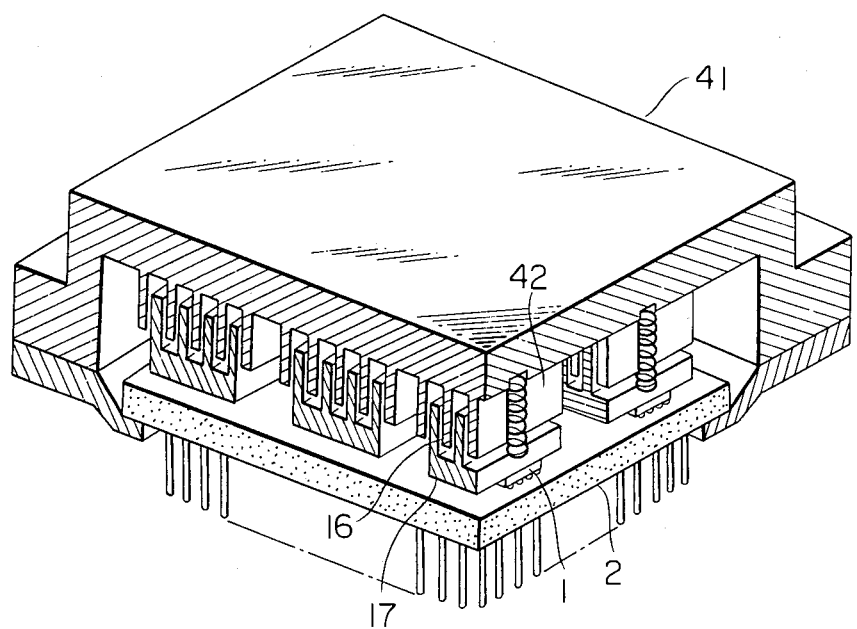
FIG. 10 is a perspective view of a cooling device for semiconductor chips according to another embodiment of the present invention.

FIG. 10 shows another embodiment of the present invention, in which a group of the fins 42 provided on the housing 41 is separately or independently provided so as to correspond to each one LSI chip 1. The other structure of this embodiment is the same as that of the embodiment shown in FIG. 1. This mentioned structure offers an advantage of preventing the fins 16 of the thermal conductive member 17 and the fins 42 of the housing 41 from being intermeshed with each other even when the housing 41 undergoes a thermal deformation, or a deformation due to a stress produced by application of, for example, an external force.

Figure 11:
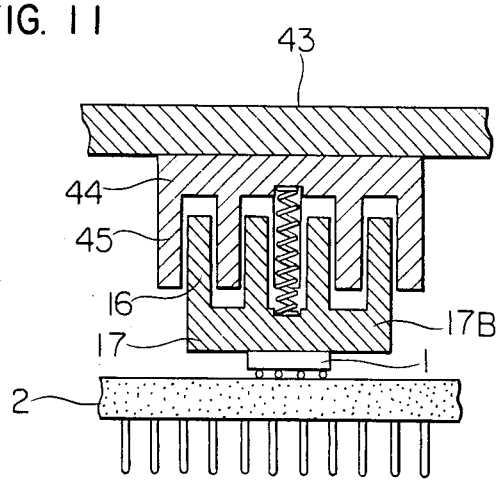
FIG. 11 is a vertical cross-sectional view of another embodiment of the present invention.

FIG. 11 shows another embodiment of the present invention, in which the fins 45 of the housing 43 are formed as the fins of a thermal conductive member 44 which is provided on the housing 43 side in the same manner as the thermal conductive member 17 on the LSI chip 1 side, and then this thermal conductive member 44 is joined to the inner surface of the housing 43. Since, in this embodiment, both the thermal conductive members 17 and 44 can be manufactured in the same process of manufacture, it is possible easily to manufacture the fins 16 and 45 with the same precision. Further, the productivity of the housing which is achieved by fabricating fins separately from housing is higher than that which is achieved by fabricating fins integrally.

Figure 12:
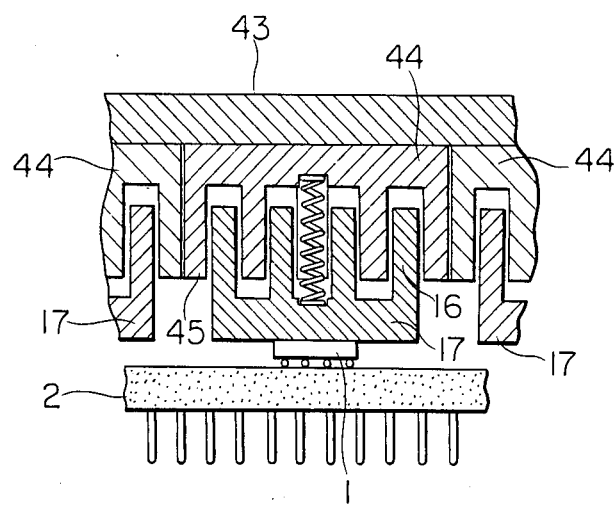
FIGS. 12 and 13 are cross-sectional views of the housing of the other embodiments of the present invention, respectively.

FIG. 12 shows another embodiment of the present invention, in which the top surface area of each thermal conductive member 44 is made equal to the maximum area 51 shown in FIG. 4 which can be occupied by one LSI chip 1, and the thermal conductive member 44 is formed as a separate member from the housing 43 and made slidable with respect thereto. According to this embodiment, since the two adjacent of the thermal conductive members 44 come into contact with each other, each thermal conductive member 44 is prevented from being horizontally moved, so that the position of this member 44 within the housing 43 is automatically fixed. Accordingly, the housing 43, thermal conductive member 44, and thermal conductive member 17 can respectively be independently formed, with the result that their respective productivities are enhanced.

Figure 13:
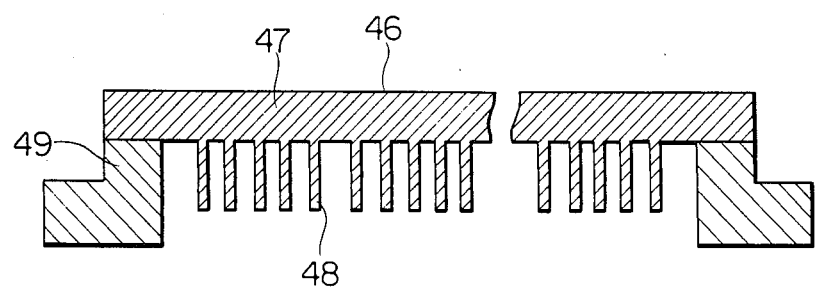

FIG. 13 shows another embodiment of the present invention, in which the housing 46 is divided into a ceiling portion 47 and a side frame portion 49. When the fins 48 of the housing 46 are fabricated, if the side frame portion 49 is separate beforehand from the ceiling portion of the housing 46, said fins 48 become easy to fabricate particularly by cutting working. Further, the substrate 2 on which a large number of wiring pattern are distributed is generally low in mechanical strength and, therefore, a flange for sealing the housing is provided as a separate member. In this embodiment, since the ceiling portion 47 is made of the same material as that of the substrate 2, their coefficients of thermal expansion can be made the same. Furthermore, it is also possible to use the materials of the same mechanical strength with respect to the side frame portion 49 and the sealing flange, respectively. By using different materials with respect to the ceiling portion 47 and the side frame portion 49 as mentioned above, it is possible to obtain various advantages including enhancement in the sealing performance, reduction in the thermal stress, rise in the productivity, etc., of the housing.

In each of the above-mentioned embodiments, description was made on the assumption that the height of the fins of each thermal conductive member, or the number of such fins, is the same with respect to each LSI chip 1. Since the operating condition or electric circuit of each SLI chip 1 differ, the amount of heat generated therein also differs. Therefore, in order to increase the reliability of the LSI chip in respect of its operation, it is necessary to keep the LSI chip's temperature constant. In this connection, if the height of the fins of the thermal conductive member, or the height of the fins of the housing, or the number of such fins is adjusted in accordance with the operating condition of the corresponding LSI chip 1, then it will be possible to easily control that LSI chip's temperature. Note here in this connection that even when the height of the fins of the thermal conductive member is made low, the length of the spring for pressing the thermal conductive member is not required to be varied.

The material of which the thermal conductive member or housing is made, generally, of copper or aluminium having high thermal conductivity. On the other hand, the back planar surface of the LSI chip is electrically conductive unless it is subjected to a special electrical insulation. For this reason, if the thermal conductive member made of copper or aluminium is pressed onto such back planar surface of the LSI chip, each LSI chip will be mutually shortened. Accordingly, when the thermal conductive member or housing is made of a Si-C material which has an electrical insulation property and at the same time has a high thermal conductivity, it is possible not only to cause the thermal conductive member or housing to have a high thermal conductivity between the thermal conductivity of copper and that of aluminum but also to make small the difference in thermal coefficient of expansion between the thermal conductive member or housing and the substrate of LSI chip.

It is to be noted here that the number of fins and the number of LSI chips may be changed without departing from the spirit and scope of the invention.

Further, it will be appreciated that a change from semiconductor chips shown in FIGS. 1 to 12 to multichip module package in which a number of semiconductor chips are contained may be made without departing from the scope of the invention, in the preferred embodiment.

Figure 14:
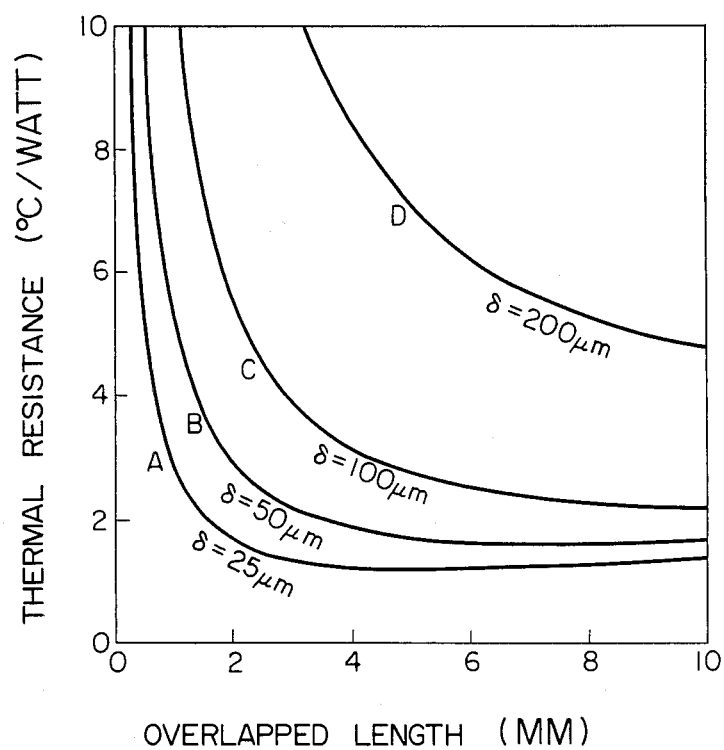
FIGS. 14 to 16 are graphs showing the relationship of the overlapped length of the fins in the vertical direction with thermal resistance and the relationship of the number of first fins with thermal resistance, for purpose of proving the performance of the present invention.
Figure 15:
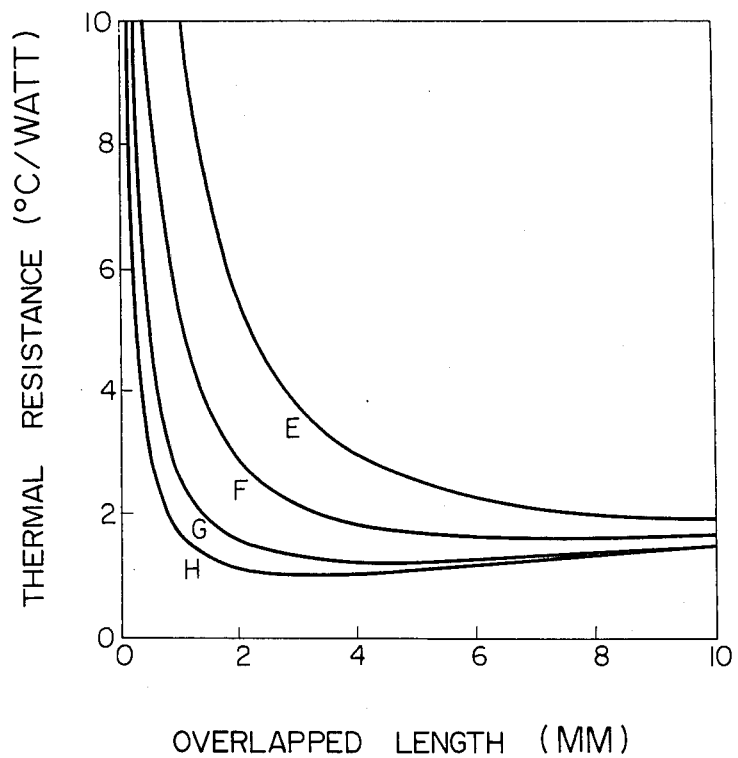
Figure 16:
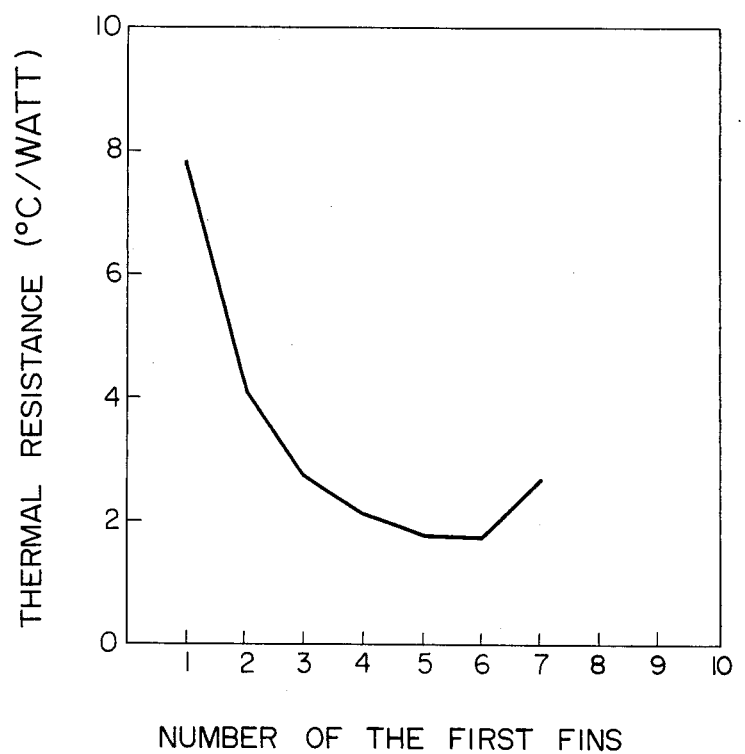

Examination was made of the performance of the cooling device according to the present invention, the results being presented in FIGS. 14 to 16.

The examination was performed under the following conditions: wherein the LSI chip has a size of 4 mm square; the maximum area occupied by one LSI chip is 9 mm square; the material of which the thermal conductive member and the housing are respectively made is aluminum; and the gas which is sealed into the housing is helium. Further, the base portion of the thermal conductive member is not over the maximum size of 8 mm square so as to prevent the two adjacent thermal conductive members from abutting against each other.

FIG. 14 shows the thermal resistance between the thermal conductive member and the housing, with respect to the overlapped length of the fins in the vertical direction, which was measured when the thickness of each of the first fins of the thermal conductive member and that of the second fins of the housing are respectively 1 mm which is a fixed value; and the number and the depth of the first fins is 4 and 8 mm, respectively, which are fixed values, and when, under these conditions, the respective heights of the first fins and the second fins are made high and the overlapped length of these first and second fins in the vertical direction is increased up to 10 mm, the clearance between the first and the second fins being used as a parameter. In the Figure, curves A, B, C and D correspond to the clearances of 25 μm, 50 μm, 100 μm, and 200 μm, respectively. If the clearance is fixed, there exists an overlapped length of the fins which makes the thermal resistance minimum. For example, if the clearance is 25 μm, the optimum overlapped length is approximately 5 mm. As the clearance increases up to 50 μm, 100 μm and 200 μm in the order mentioned, the optimum overlapped length increases accordingly. The reason for this is as follows. That is, when the overlapped length is small or short, the thermal resistance to heat conduction in each of the first and the second fins is decreased. However, the whole thermal resistance between the thermal conductive member and the housing is increased in the long run due to a decrease in the overlapped area between the first and the second fins. On the other hand, when the overlapped length is large or long, although the overlapped area is increased, the whole thermal resistance is increased due to an increase in the thermal resistance to heat conduction in each of the first and the second fins.

On the other hand, FIG. 15 shows the thermal resistance between the thermal conductive member and the housing, with respect to the overlapped length, which was measured under the condition of which the clearance between the first fin and the second fin is made 50 μm constant; the base portion of the thermal conductive member is made 8 mm square; and the thicknesses of the first and the second fins are made as a parameter. In the Figure, curves E, F, G and H correspond to the thicknesses and the numbers of the fin provided on the thermal conductive member, namely, (2.6 mm, 2), (1.0 mm, 4), (0.4 mm, 8) and (0.2 mm, 16), respectively. As seen, the thermal resistance is decreased as the fin numbers are increased. It should be noted here that the sample represented by the curve B of FIG. 14 is the same as that which is represented by the curve F of FIG. 15.

As will be understood from FIGS. 14 and 15, if the fin thickness is decreased; the fin numbers are increased; the clearance between the fins is decreased; and yet an optimum overlapped length is selected, then it will be possible to make the thermal resistance small.

FIG. 16 shows the thermal resistance between the thermal conductive member and the housing, with respect to the number of the first fins, which was measured when the thickness of the first fin is 1 mm; the height thereof is 4 mm; the overlapped length is 3 mm; and the clearance between the first and second fins is 50 μm, and, under these conditions, the number of the first and the second fins is increased sequentially by decreasing only the thickness of the second fins. As seen, as the number of the first fins is increased, the thermal resistance is decreased. However, when the first-fin number increases over certain numbers, the thermal resistance increases because of a reduction in thickness of the second fins. When it is desired to increase the fin numbers, it is sufficient to make the thicknesses of the first and the second fins small and at the same time make the overlapped length short as shown in FIG. 15.

What is claimed is:

1. A cooling device for providing cooling of integrated circuit semiconductor chips by effecting transfer of heat generated in a plurality of semiconductor chips mounted on a circuit substrate to a housing so as to dissipate said heat, comprising a housing; a plurality of separate thermal conductive members each positioned with one side thereof in contact with a back planar surface of a respective semiconductor chip and having the other side thereof positioned in spaced relationship with the housing so as to provide a small clearance between the other side of each thermal conductive member and said housing, each of said thermal conductive members including a base portion having a bottom surface in contact with a back planar surface of the semiconductor chip, the area of said bottom surface being greater than the surface area of said back planar surface of the semiconductor chip, and a plurality of first fins integral with said base portion and extending in a direction perpendicular to said bottom surface; a plurality of second fins each integrally provided with said housing in fitted relation to said plurality of first fins and each of said second fins extending continuously substantially over an entire length of the housing in parallel with each other, each of said plurality of second fins fitting with said first fins of several of said thermal conductive members; and a plurality of resilient members in the form of springs, each of said springs being mounted between a respective one of said thermal conductive members and said housing, each of said springs being inserted in a gap surrounded by the first and second fins and fixedly held in a recess formed in said housing and a recess formed in the center of the base portion of said thermal conductive member; said first and second fins forming a plurality of parallel plate-like members, wherein said plurality of first fins are telescopically movable with respect to said plurality of second fins with a small clearance existing therebetween.

2. A cooling device for cooling semiconductor chips as claimed in claim 1, wherein said gap is formed by cutting away a portion of said second fins.

3. A cooling device for cooling semiconductor chips claimed in claim 1, wherein said housing comprises a ceiling member being integrally provided with said plurality of second fins, and a side frame member.

4. A cooling device for providing cooling of integrated semiconductor chips by effecting transfer of heat generated in a plurality of semiconductor chips mounted on a circuit substrate to a housing so as to dissipate said heat, comprising a housing; a plurality of separate thermal conductive members each contacting at one side thereof a back planar surface of a respective one of said plurality of semiconductor chips and having another side thereof positioned in spaced relationship with the housing so as to provide a small clearance between the other side of each thermal conductive member and said housing, each of said thermal conductive members including a base portion having a bottom surface in contact with the back planar surface of the respective semiconductor chips the area of said bottom surface being greater than the surface area of said back planar surface of the semiconductor chip, and a plurality of first fins integral with said base portion and extending in a direction perpendicular to said bottom surface; a plurality of second fins each integrally provided with said housing in fitted relation to said plurality of first fins and extending continuously substantially over an entire length of the housing and being disposed in parallel with each other, each of said plurality of second fins fitting with said first fins of several of said thermal conductive members; and a plurality of resilient members in the form of springs, each of said springs being mounted between a respective one of said thermal conductive members and said housing, each of said springs being respectively members and said housing, inserted in a gap surrounded by the first and second fins and fixedly held in a recess formed in said housing and a recess formed in the center of the base portion of said thermal conductive members; said first and second fins respectively including a plurality of parallel plate-like members of a thickness in a range of 0.2–2.6 mm, and wherein said plurality of first fins are telescopically movable with respect to said plurality of second fins with a small clearance existing therebetween.

* * * * *